United States Patent
Obata

(10) Patent No.: US 10,770,621 B2
(45) Date of Patent: Sep. 8, 2020

(54) SEMICONDUCTOR WAFER

(71) Applicant: Stanley Electric Co., Ltd., Tokyo (JP)

(72) Inventor: Toshiyuki Obata, Yamaguchi (JP)

(73) Assignee: Stanley Electric Co., Ltd., Tokyo (JP)

( * ) Notice: Subject to any disclaimer, the term of this patent is extended or adjusted under 35 U.S.C. 154(b) by 74 days.

(21) Appl. No.: 16/092,007

(22) PCT Filed: Apr. 7, 2017

(86) PCT No.: PCT/JP2017/014519
§ 371 (c)(1),
(2) Date: Oct. 8, 2018

(87) PCT Pub. No.: WO2017/175860
PCT Pub. Date: Oct. 12, 2017

(65) Prior Publication Data
US 2019/0115499 A1    Apr. 18, 2019

(30) Foreign Application Priority Data
Apr. 8, 2016 (JP) .................. 2016-077829

(51) Int. Cl.
*H01L 33/20* (2010.01)
*H01L 33/32* (2010.01)
(Continued)

(52) U.S. Cl.
CPC .......... *H01L 33/20* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 21/02505* (2013.01); *H01L 21/02576* (2013.01); *H01L 21/02579* (2013.01); *H01L 33/007* (2013.01); *H01L 33/24* (2013.01); *H01L 33/32* (2013.01); *H01L 33/0095* (2013.01); *H01L 33/145* (2013.01)

(58) Field of Classification Search
CPC ................................. H01L 21/02428
See application file for complete search history.

(56) References Cited

U.S. PATENT DOCUMENTS

| 6,252,261 B1 | 6/2001 | Usui et al. |
| 10,309,037 B2 | 6/2019 | Lipski et al. |

(Continued)

FOREIGN PATENT DOCUMENTS

| JP | 2000349338 A | 12/2000 |
| JP | 2002222772 A | 8/2002 |

(Continued)

OTHER PUBLICATIONS

International Preliminary Report on Patentability, dated Oct. 18, 2018.

(Continued)

*Primary Examiner* — Fernando L Toledo
*Assistant Examiner* — Valerie N Newton
(74) *Attorney, Agent, or Firm* — Cahn & Samuels, LLP

(57) ABSTRACT

A semiconductor wafer has, on one surface of a sapphire substrate, an element layer including an n-type layer, an active layer, and a p-type layer, and is characterized in that the surface of the element layer is bent in a convex way, and the curvature thereof is 530-800 $km^{-1}$.

19 Claims, 2 Drawing Sheets

(51) Int. Cl.
  *H01L 21/02* (2006.01)
  *H01L 33/24* (2010.01)
  *H01L 33/00* (2010.01)
  *H01L 33/14* (2010.01)

(56) References Cited

U.S. PATENT DOCUMENTS

| | | | |
|---|---|---|---|
| 2003/0045103 A1 | 3/2003 | Suzuki et al. | |
| 2003/0122478 A1* | 7/2003 | Suehiro | H01L 33/22 313/498 |
| 2005/0167683 A1 | 8/2005 | Lee et al. | |
| 2013/0161797 A1* | 6/2013 | Aida | C30B 33/04 257/622 |
| 2013/0168691 A1 | 7/2013 | Sakai | |
| 2014/0050244 A1* | 2/2014 | Ohno | H01L 33/20 372/46.01 |
| 2014/0061661 A1* | 3/2014 | Sako | C30B 25/186 257/76 |
| 2016/0005924 A1 | 1/2016 | Iwai et al. | |
| 2016/0265140 A1* | 9/2016 | Aida | C30B 25/186 |

FOREIGN PATENT DOCUMENTS

| | | |
|---|---|---|
| JP | 2005116785 A | 4/2005 |
| KR | 20050077915 A | 8/2005 |
| KR | 20150003723 A | 1/2015 |
| WO | 2005099057 A1 | 10/2005 |
| WO | WO 2011065745 A2 | 6/2011 |

OTHER PUBLICATIONS

International Search Report, PCT/JP2017/014519, dated Jun. 13, 2017.
English Abstract of WO2005099057, Oct. 20, 2005.
English Abstract of JP2002222772, Aug. 9, 2002.
English Abstract of JP2000349338, Dec. 15, 2000.
Hu et al. "Deep ultraviolet light-emitting diodes," Phys. stat. sol. (a) 203, No. 7, 1815-18 (2006).
English Abstract of KR 20150003723, Jan. 9, 2015.
English Abstract of WO 2011065745, Jun. 3, 2011.
English Abstract of JP 2005116485, Apr. 28, 2005.
Extended European Search Report dated Oct. 7, 2019.

* cited by examiner

[FIG. 1]
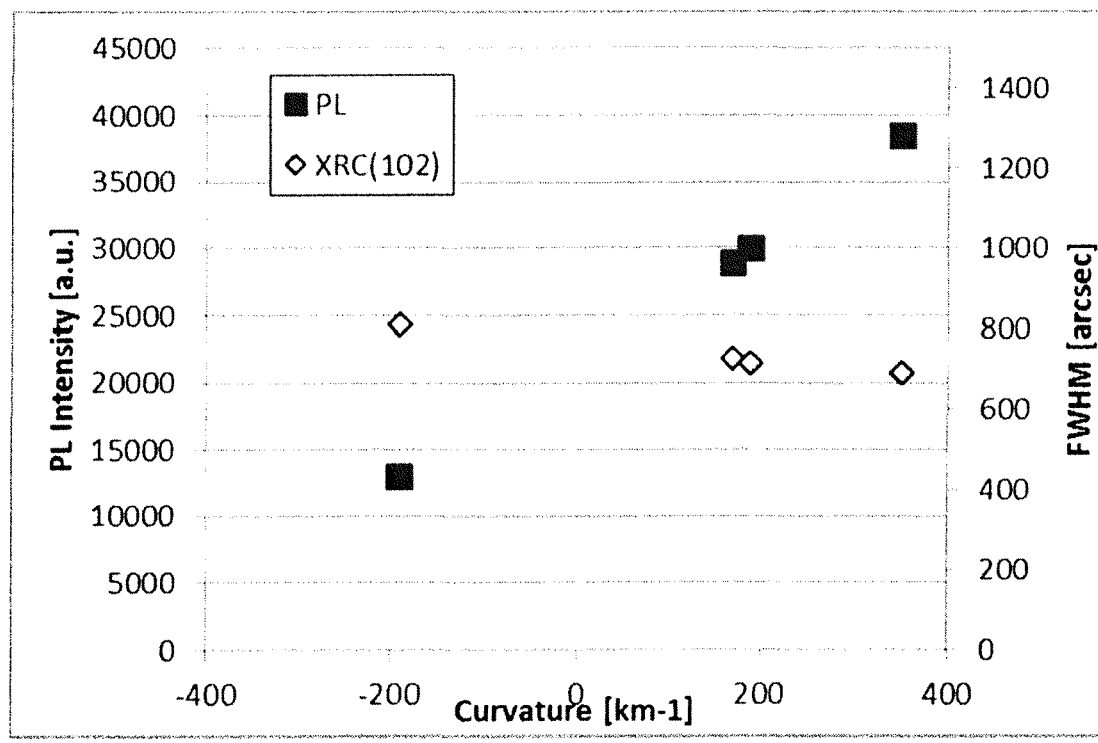
[FIG. 2]
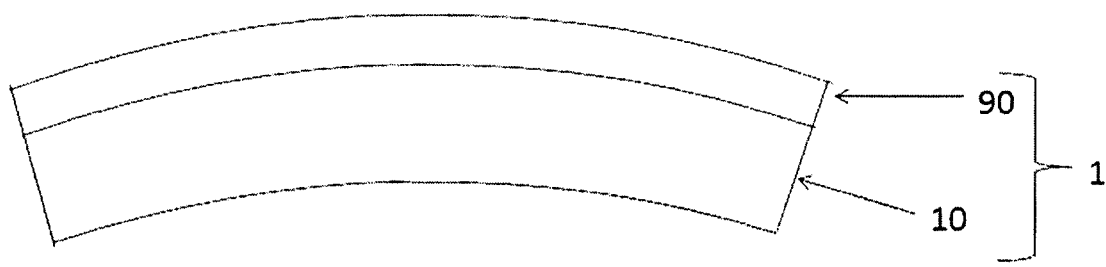

[FIG. 3]
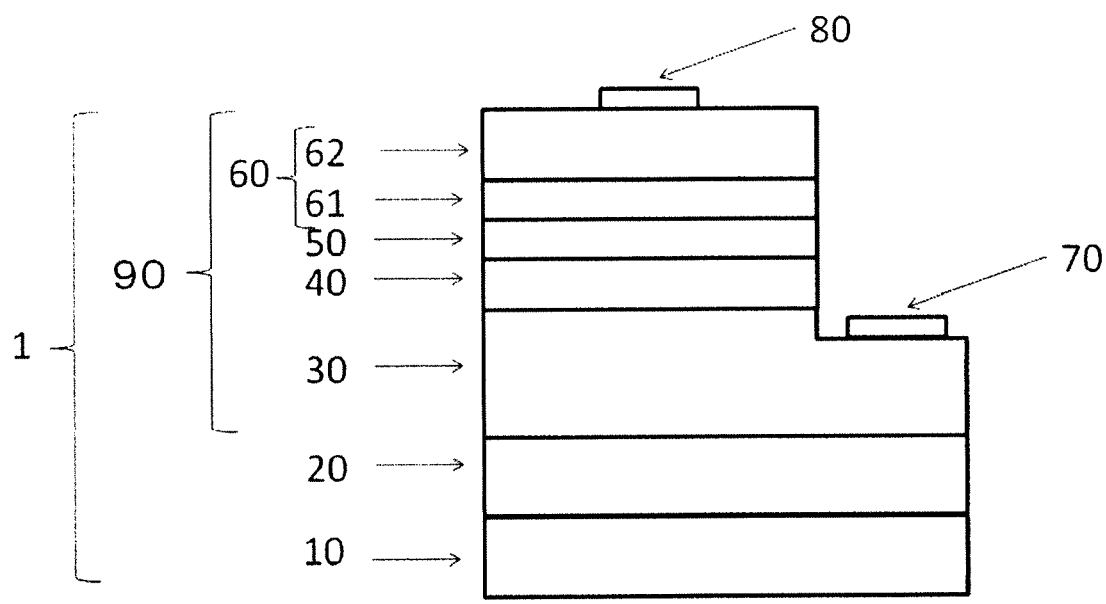

SEMICONDUCTOR WAFER

This application is a U.S. national stage application of PCT/JP2017/014519 filed on 7 Apr. 2017 and claims priority to Japanese patent document 2016-077829 filed on 8 Apr. 2016, the entireties of which are incorporated herein by reference.

TECHNICAL FILED

The present invention relates to a novel semiconductor wafer. Specifically, the present invention relates to a novel semiconductor wafer, which includes an element layer including an n-type layer, an active layer, and a p-type layer on one surface of a sapphire substrate, and in which a surface of the element layer is bent in a convex way, and a curvature thereof is within a specific range.

BACKGROUND OF THE INVENTION

Semiconductor wafers used for light emitting diodes or the like are generally manufactured by growing an element layer or the like for exhibiting a desired function on a base substrate by chemical vapor deposition methods such as a metal organic chemical vapor deposition method (MOCVD method), a molecular beam epitaxy method (MBE method), or a halide vapor phase epitaxy method (HVPE method). Among these, when the element layer is made of, for example, group III nitride single crystal layers containing a mixed crystal of, for example, indium nitride (InN), gallium nitride (GaN), aluminum nitride (AlN), a highly efficient light emitting device in a wavelength range from the infrared region to the ultraviolet region corresponding to the respective band gap energies (0.7 eV (InN), 3.4 eV (GaN), and 6.1 eV (AlN)) can be produced by controlling the mixed crystal composition of In, Ga, Al which are group III elements. Therefore, a blue light emitting diode using a group III nitride semiconductor is used as a white light emitting diode combined with phosphors in a wide variety of applications including lighting applications or the like.

In recent years, development of ultraviolet light emitting diodes has been progressed, and development of ultraviolet light emitting diodes having an emission peak wavelength at short wavelength, for example, an emission peak wavelength at 350 nm or less has also been progressed. Many attempts have been made to use a sapphire substrate as a base substrate in the ultraviolet light emitting diodes in view of the ability of growing the III group nitride crystal and transmittance of ultraviolet light (see non-Patent Document 1).

However, when a dissimilar material substrate different from the group III nitride, such as a sapphire substrate, is used as the base substrate, because of a large difference of lattice constant between the group III nitride single crystal layer (element layer) and the base substrate (sapphire substrate), there is a problem that high density defects (dislocation density) occurs in the group III nitride single crystal layer at an interface between the group III nitride single crystal layer and the base substrate. As a result, the defect density in the element layer is also increased, and the optical output is lowered.

CITATION LIST

Non Patent Document

Non Patent Document 1: phys. stat. sol. (a) 203, (2006) 1815

SUMMARY OF INVENTION

The problem of dislocation density caused by the large lattice constant difference between the group III nitride single crystal layer (element layer) and the base substrate (sapphire substrate) is inherently an inevitable problem. Therefore, it is very difficult to grow a group III nitride single crystal layer (element layer) with a reduced dislocation density on the sapphire substrate.

Accordingly, an object of the present invention is to provide a semiconductor wafer with high output and finally a semiconductor light emitting device obtained from the semiconductor wafer when a sapphire substrate is used as a base substrate.

Solution to Problem

In order to solve the above problems, the inventors of the present invention have conducted intensive studies. In a case of using a sapphire substrate, various growth conditions have been examined, and attempts have been made to produce a semiconductor wafer having high optical output even if the dislocation density of the element layer cannot be reduced. As a result, it is found that a high output can be obtained even if the dislocation density cannot be reduced when the obtained semiconductor wafer is bent in a specific direction at a specific ratio, and thus the present invention has been completed.

That is, the present invention relates to a semiconductor wafer including an element layer including an n-type layer, an active layer, and a p-type layer on one surface of a sapphire substrate, wherein a surface of the element layer is bent in a convex way, and a curvature thereof is 530 km$^{-1}$ to 800 km$^{-1}$. The surface of the element layer refers to the surface of the uppermost element layer, not a sapphire substrate side.

According to the present invention, a high output semiconductor wafer and a semiconductor chip can be obtained. The semiconductor wafer exhibits high output even if an element layer made of a group III nitride single crystal layer is formed on a sapphire substrate which is a substrate of dissimilar material, even though the effect of reducing the dislocation density is low. Therefore, since a semiconductor wafer having an emission peak wavelength at the ultraviolet region can be manufactured using a general-purpose sapphire substrate, the semiconductor wafer has a high industrial utility value.

BRIEF DESCRIPTION OF DRAWINGS

FIG. 1 is a graph showing a relationship of a curvature during growth of a n-type AlGaN layer, a PL (photoluminescence) intensity after growth and a half-value width in a (102) plane rocking curve measurement in a preliminary experiment.

FIG. 2 is an image diagram of a form of a semiconductor wafer in the present invention.

FIG. 3 is a representative view showing a configuration of a semiconductor light emitting device (chip) in the present invention.

DETAILED DESCRIPTION OF INVENTION

Hereinafter, embodiments of the present invention will be described with reference to the drawings. FIG. 3 shows a representative example of a semiconductor chip obtained by the method of the present invention. It will be appreciated that the semiconductor wafer has a plurality of configurations of the semiconductor chip in FIG. 3, and the layer constitution and the like are the same for the semiconductor wafer and the semiconductor chip.

(Configuration of Semiconductor Wafer)

A semiconductor wafer 1 of the present invention includes an element layer 90 containing the element layer 90 including an n-type layer 30, an active layer 40, and a p-type layer 60 on one surface of a sapphire substrate 10. The element layer has a characteristic in that a surface thereof is bent in a convex way (FIG. 2).

(Characteristics of Semiconductor Wafer)

The semiconductor wafer of the present invention has a characteristic in that the surface of the element layer 90 is bent in a convex way. The curvature indicating the degree of bending is 530 km$^{-1}$ to 800 km$^{-1}$. The curvature can be measured by X-ray diffraction (XRD), a laser displacement meter, and an interference microscope. In the present invention, the curvature is a value measured with a laser displacement meter. The curvature is a value obtained from the surface of the element layer 90 in the semiconductor wafer before forming an electrode. That is, the curvature means a curvature of the outermost surface of the p-type layer 60, and when the p-type layer 60 includes a p-type contact layer 62, the curvature means a curvature of the surface of the p-type contact layer 62. In addition, when the curvature of the surface varies depending on the measurement site, the curvature means an average value of curvatures at three or more measurement points.

When the element layer 90 is formed on the sapphire substrate 10, for example, when the element layer 90 is made of group III nitride single crystal layers, dislocation occurs in the element layer 90 due to the difference in lattice constant. Many attempts have been made to reduce this dislocation by improving the production method or by providing a buffer layer 20 or the like, but at present this dislocation cannot be reduced sufficiently. According to the present invention, a high output semiconductor wafer can be obtained even if the dislocation is present to a certain extent. Not particularly limited, the dislocation density of the element layer 90 in the present invention is $1\times10^8$ [cm$^{-2}$] to $1\times10^9$ [cm$^{-2}$]. The dislocation density is a value measured by a transmission electron microscope and is a value obtained by confirming the dislocation density of the n-type layer 30.

In the present invention, it is not preferred that the surface of the element layer 90 of the sapphire substrate 10 is not bent or is bent into a recessed shape, since the optical output is lowered. As for the reason why that the advantageous effect is attained when the curvature of the convex surface of the element layer 90 is 530 km$^{-1}$ to 800 km$^{-1}$, the inventors of the present invention presume as follows.

The inventors of the present invention have found that when an n-type AlGaN layer is grown on the sapphire substrate 10 under various conditions, X-ray rocking curves of the (102) plane are about the same (700 to 800 [arcsec]; indicating that the dislocation density does not change), but the PL intensity of the n-type AlGaN layer can be increased by increasing the curvature of the obtained laminate (surface of the n-type AlGaN layer) to a certain extent (see FIG. 1). From this result, it is suggested that if the surface of the element layer 90 can be bent to a certain extent in a convex shape, the dislocation density in the active layer or the like will not be increased, and incorporation of impurities and point defects will be suppressed. In addition, the inventors of the present invention have found that the optical output can be efficiently increased by setting the curvature of the surface of the element layer 90 to 530 km$^{-1}$ to 800 km$^{-1}$, and thus complete the present invention.

In the present invention, it is not preferred that the curvature of the surface of the element layer 90 is less than 530 km$^{-1}$, since the effect of improving the optical output is small. It is also not preferred that the curvature of the surface of the element layer 90 is more than 800 km$^{-1}$, since the semiconductor wafer is bent too largely to be subjected to post processing such as polishing and is difficult to be used as a product. In addition, it is difficult to produce a semiconductor wafer having a curvature more than 800 km$^{-1}$. Considering improvement of optical output, handling property, productivity or the like, the curvature is preferably 600 km$^{-1}$ to 800 km$^{-1}$, and more preferably 600 km$^{-1}$ to 750 km$^{-1}$.

Hereinafter, the substrate and each layer will be described in turn.

(Sapphire Substrate)

The sapphire substrate 10 is not particularly limited, and a known substrate produced by a known method can be used. A thickness of the sapphire substrate 10 is not particularly limited and is usually 300 μm to 600 μm.

The sapphire substrate 10 preferably has a (0001) plane as a growth plane (a plane on which the element layer is grown).

(Preferred Element Layer 90)

In the semiconductor wafer 1 of the present invention, the element layer 90 is formed on the sapphire substrate 10. The composition of the element layer 90 is not particularly limited. In order to remarkably exhibit the effect of the present invention, the element layer 90 may be composed of group III nitride single crystal layers, and especially may be made of AlGaInN layers satisfying a composition represented by AlxInyGazN (x, y, and z are rational numbers satisfying 0.3≤x≤1.0, 0≤y 0.7, and 0≤z≤0.7, and x+y+z=1.0). The reason is that the group III nitride single crystal layer, particularly an AlxInyGazN layer having the above composition, particularly has a large lattice constant difference from the sapphire substrate and tends to cause dislocation, and as a result, the optical output tends to be lowered easily. Unlike a conventional layer constitution of a semiconductor wafer in which dislocation occurs at a high density and the output is lowered, the optical output can be increased without changing the layer constitution by the present invention. Therefore, the present invention can exhibit an excellent effect when the element layer 90 contains Al. Specifically, the present invention is suitable for an ultraviolet light emitting diode (wafer) having an emission peak wavelength at the ultraviolet region, specifically in a range of 200 nm to 350 nm.

In the present invention, the element layer 90 may be directly formed on the sapphire substrate 10, or as shown in FIG. 3, the element layer 90 is preferably formed after the buffer layer 20 is formed. Next, the buffer layer 20 will be described.

(Buffer Layer 20)

In the present invention, when a buffer layer is provided, the buffer layer 20 is preferably made of a group III nitride single crystal layer and is preferably an AlGaInN layer satisfying a composition represented by $Al_{X1}In_{Y1}Ga_{Z1}N$ (X1, Y1, and Z1 are rational numbers satisfying 0.8≤X1≤1, 0≤Y1≤0.2, and 0≤Z1≤0.2, and X1+Y1+Z1=1.0). Among them, when the semiconductor wafer 1 of the present invention is used for an ultraviolet light emitting diode, it is preferably that 0.9≤X1≤1, 0≤Y1≤0.1, and 0≤Z1≤0.1, and it is most preferably that a buffer layer 20 made of AlN is adopted considering the productivity.

A thickness of the buffer layer 20 is not particularly limited and is preferably 0.01 μm to 5 μm. The buffer layer 20 may be a single layer or may be a plurality of layers of two or more as described in detail below. The plurality of layers may be layers having different compositions or may be layers having the same composition but different growth conditions. The layers having the same composition but different growth conditions mean the layers that are grown while changing a ratio (V/III ratio) of the number of moles of nitrogen source gas to the number of moles of a group III raw material gas, the ratio being one of the growth conditions. Most preferred is two or more layers of AlN grown while changing the V/III. In addition, the buffer layer 20 may be a gradient layer whose composition continuously changes.

In the present invention, it is preferable to form the element layer 90 on the buffer layer 20. Next, each layer constituting the element layer 90 will be described.

(n-Type Layer 30)

In the present invention, the n-type layer 30 is formed on the sapphire substrate 10 via the buffer layer 20 as required. The n-type layer 30 is a layer doped with an n-type dopant. Although the n-type layer 30 is not particularly limited, for example, it is preferable that the n-type layer 30 exhibits n-type conductivity by containing Si as a dopant in a range where the impurity concentration is $1\times10^{16}$ [cm$^{-3}$] to $1\times10^{21}$ [cm$^{-3}$]. The dopant material may be a material other than Si.

As described above, the present invention can be conveniently applied to an ultraviolet light emitting diode having an emission peak wavelength at the range of 200 nm to 350 nm. Therefore, the n-type layer 30 is preferably made of a group III nitride single crystal layer, and is preferably made of an AlGaInN layer satisfying a composition represented by $Al_{X2}In_{Y2}Ga_{Z2}N$ (X2, Y2, and Z2 are rational numbers satisfying $0.3 \leq X2 \leq 1.0$, $0 \leq Y2 \leq 0.7$, and $0 \leq Z2 \leq 0.7$, and X2+Y2+Z2=1.0). The n-type layer 30 may be a gradient layer whose composition continuously changes. In addition, the thickness of the n-type layer 30 is preferably 0.1 μm to 20 μm.

(Active Layer 40)

The active layer 40 is formed on the n-type layer 30. The active layer 40 may be composed of, for example, one or more well layers and barrier layers. The number of wells composed of the well layers and the barrier layers may be one, or two or more. In the case of two or more, although not particularly limited, the number is preferably 10 or less considering the productivity of the nitride semiconductor light emitting device. In addition, the layer in contact with the n-type layer 30 may be either a well layer or a barrier layer.

(Barrier Layer)

The active layer 40 is made of a well layer and a barrier layer. In general, a band gap of the barrier layer is larger than that of the well layer. That is, the barrier layer is formed of an AlGaInN layer having an Al composition ratio higher than that of the well layer. As described above, the semiconductor wafer of the present invention can be conveniently applied to an ultraviolet light emitting diode. Therefore, the barrier layer is preferably made of an AlGaInN layer satisfying a composition represented by $Al_{X3}In_{Y3}Ga_{Z3}N$ (X3, Y3, and Z3 are rational numbers satisfying $0.3 \leq X3 \leq 1.0$, $0 \leq Y3 \leq 0.7$, and $0 \leq Z3 \leq 0.7$, and X3+Y3+Z3=1.0). In addition, the thickness of the barrier layer 42 is preferably 2 nm to 50 nm.

(Well Layer)

The band gap of the well layer is smaller than that of the barrier layer. That is, the well layer is formed of an AlGaN single crystal having an Al composition ratio lower than that of the barrier layer. As described above, the semiconductor wafer of the present invention can be conveniently applied to an ultraviolet light emitting diode. Therefore, the well layer is preferably made of an AlGaInN layer satisfying a composition represented by $Al_{X4}In_{Y4}Ga_{Z4}N$ (X4, Y4, and Z4 are rational numbers satisfying $0.1 \leq X4 \leq 0.9$, $0.1 \leq Y4 \leq 0.8$, and $0 \leq Z4 \leq 0.8$, and X4+Y4+Z4=1.0. Wherein, X3>X4 and Z3≤Z4.). In addition, a thickness of the well layer 41 is preferably 1 nm to 20 nm.

(Electron Blocking Layer 50)

In the present invention, the p-type layer 60 may be formed directly on the active layer 40, but the p-type layer 60 is preferably formed via the electron blocking layer 50. The electron blocking layer 50 suppresses leakage of a part of electrons injected from the n-type layer 30 into the active layer 40 to a p-type layer 60 side due to application of an electric field. Therefore, the electron blocking layer 50 can be substituted by a p-type clad layer 61 to be described later, but by providing the electron blocking layer 50, an Al composition of the p-type clad layer can be lowered, and a film thickness can be reduced, and as a result, a driving voltage can be reduced.

When the electron blocking layer 50 is provided, a band gap of the electron blocking layer 50 is preferably larger than the band gap of the active layer 40 (a barrier layer having the maximum band gap in the active layer (having the maximum Al composition)) and that of a layer forming the p-type layer 60 to be described later. Therefore, the electron blocking layer 50 is preferably formed of a single crystal made of AlInGaN having an Al composition ratio higher than that of the above layers. That is, the electron blocking layer 50 is preferably formed of an AlInGaN single crystal layer having an Al composition higher than any of the other layers. Therefore, the electron blocking layer 50 is preferably made of an AlInGaN layer satisfying a composition represented by $Al_{X5}In_{Y5}Ga_{Z5}N$ (X5, Y5, and Z5 are rational numbers satisfying $0.7 \leq X5 \leq 1$, $0 \leq Y5 \leq 0.3$, and $0 \leq Z5 \leq 0.3$, and X5+Y5+Z5=1.0), and is particularly preferably made of an AlN single crystal layer. The electron blocking layer 50 may be a gradient layer whose composition continuously changes.

In addition, the electron blocking layer 50 may be an undoped layer or a p-type layer. In the case of a p-type layer, it is preferable that the p-type layer contains p-type dopant such as Mg in a range where the impurity concentration is $1\times10^{16}$ [cm$^{-3}$] to $1\times10^{21}$ [cm$^{-3}$]. A thickness of the electron blocking layer 50 is preferably 1 nm to 50 nm.

(p-Type Layer 60)

In the present invention, the p-type layer 60 is formed on the active layer 40 or on the electron blocking layer 50 provided as required. The p-type layer 60 is not particularly limited and is preferably made of the p-type clad layer 61 and the p-type contact layer 62 on which a p-electrode 80 is formed.

(p-Type Clad Layer 61)

As described above, the semiconductor wafer 1 of the present invention can be conveniently applied to an ultraviolet light emitting diode in the range of 200 nm to 350 nm. Therefore, the p-type clad layer 61 is preferably made of an AlInGaN layer satisfying a composition represented by $Al_{X6}In_{Y6}Ga_{Z6}N$ (X6, Y6, and Z6 are rational numbers satisfying $0.3 \leq X6 \leq 1.0$, $0 \leq Y6 \leq 0.7$, and $0 \leq Z6 \leq 0.7$, and X6+Y6+Z6=1.0).

It is preferable that the p-type clad layer 61 contains Mg as a dopant in a range where the impurity concentration is $1\times10^{16}$ [cm$^{-3}$] to $1\times10^{21}$ [cm$^{-3}$]. A thickness of the p-type clad layer 61 is not particularly limited and is preferably 1 nm to 1 μm.

(p-Type Contact Layer 62)

In the present invention, the p-type contact layer 62 in contact with the p-electrode is preferably provided on the p-type clad layer 61. By forming the p-type contact layer 62, ohmic contact with the p-electrode 80 can be easily realized and reduction in contact resistance can be easily realized.

When the p-type contact layer 62 is provided, a band gap of the p-type contact layer 62 is preferably lower than a band gap of the p-type clad layer 61. That is, the p-type contact layer 62 preferably has an Al composition ratio lower than an Al composition of the p-type clad layer 61. Therefore, the p-type contact layer 62 is preferably made of an AlInGaN layer satisfying a composition represented by $Al_{X7}In_{Y7}Ga_{Z7}N$ (X7, Y7, and Z7 are rational numbers satisfying $0 \leq X7 \leq 0.99$, $0 \leq Y7 \leq 1$, and $0 \leq Z7 \leq 1$, and X7+Y7+Z7=1.0). Most preferably, the p-type contact layer 62 is formed of a single crystal made of GaN. In addition, it is preferable that the p-type contact layer 62 contains Mg a dopant in a range where the impurity concentration is $1\times10^{16}$ [cm$^{-3}$] to $1\times10^{21}$ [cm$^{-3}$]. A thickness of the p-type contact layer 62 is not particularly limited and is preferably 1 nm to 1000 nm. When the p-type contact layer 62 is provided as described above, in the present invention, the curvature of the surface of the p-type contact layer 62 is measured.

(n-Electrode 70)

The n-electrode 70 is formed on the exposed surface of the n-type layer 30. Materials used for the n-electrode 70 can be selected from various known materials. For example, Ti, Al, Rh, Cr, V, In, Ni, Pt, Au, or the like can be used. Among these, it is preferable to use Ti, Al, Rh, Cr, V, Ni, and Au. These negative electrodes may have a single layer or multi-layer structure having a layer containing an alloy or an oxide of these metals, and a preferred combination is Ti/Al/Au from the viewpoint of ohmic property and reflectance. A thickness thereof is not particularly limited and is preferably 2 nm or more considering the stability of production, and an upper limit thereof is 2 μm.

(p-Electrode 80)

The p-electrode 80 is formed on the p-type contact layer 62. The p-electrode 80 preferably has a high transparency to ultraviolet light. Specifically, the transmittance thereof is 60% or more, and preferably 70% or more, to the light of 265 nm. Although not particularly limited, an upper limit thereof is preferably 100%, and industrially preferably 90% or more.

Metal materials used for the p-electrode 80 can be selected from various known materials. For example, Ni, Cr, Au, Mg, Zn, Pd or the like can be used. In addition, the light-transmissive positive electrode may be a single layer or multi-layer structure having a layer containing an alloy or an oxide of these metals and a preferred combination is Ni/Au.

When it is necessary for the p-electrode 80 to have translucency, the film thickness is preferably as small as possible. Specifically, the film thickness is 10 nm or less, and more preferably 5 nm or less, and a lower limit thereof is 0.5 nm. When it is not necessary for the p-electrode 80 to have a light-transmission property, the above is not the limit and the film thickness may be thick. Specifically, the film thickness is 500 nm or less, and more preferably 100 nm or less, and a lower limit thereof is 0.5 nm.

In the present invention, a semiconductor light emitting device having an n-electrode and a p-electrode on a semiconductor wafer is used, and the semiconductor wafer is cut to obtain a semiconductor chip. Next, a preferred method for producing the semiconductor wafer 1 of the present invention will be described.

(Method for Producing Semiconductor Wafer)

(Preparation of Sapphire Substrate)

In the present invention, the semiconductor wafer 1 is produced by forming the element layer 90 on the sapphire substrate 10. The sapphire substrate 10 to be used preferably has (0001) plane on which the element layer is grown. The (0001) plane may have an off angle, and it is preferable to form an element layer on the (0001) plane inclined at 0° to 5°. Further, the (0001) plane is preferably inclined to an m-axis direction.

In addition, it is preferable that the (0001) plane is smooth, and it is preferable that the (0001) plane has a surface roughness of about 0.2 nm or less. It is preferable that a bending amount (radius of curvature) of the sapphire substrate 10 before growing the element layer 90 is 10 m or more. An upper limit of the radius of curvature is not particularly limited.

In the present invention, the element layer 90 is formed on the sapphire substrate 10. Conditions for producing the semiconductor wafer of the present invention are not particularly limited, and the growth is preferably performed by a metal organic chemical vapor deposition (MOCVD) method. According to the study of the inventors of the present invention, it is found that in order to bend the element layer 90 so as to satisfy the range of the present invention, the conditions just before growing the buffer layer or the element layer on the sapphire substrate 10 are important. Specifically, it is preferable to introduce a certain amount of oxygen into a MOCVD apparatus before growing the buffer layer or the element layer on the sapphire substrate 10. However, the amount of oxygen introduced cannot be unconditionally limited since the optimum value varies depending on the capacity, shape, etc. of each apparatus. For a general MOCVD apparatus, it is preferable to introduce oxygen (air) into the apparatus by opening for about 2 minutes to about 10 minutes before setting a sapphire substrate into the apparatus. After this operation, the sapphire substrate 10 is set in the MOCVD apparatus, and thermal cleaning or the like may be performed by a known method, thereafter the buffer layer 20 or the element layer 90 is formed. Although the reason why the effect can be obtained by introducing oxygen is unclear, it is considered that a small amount of remaining oxygen influences the growth of the layer initially formed on the sapphire substrate 10, and thereby the finally obtained element layer 90 can be bent in a convex way.

In the MOCVD method, the element layer 90 can also be bent in a convex way by growing the buffer layer provided as required and the n-type layer under a pressure. Specifically, it is preferable to grow the above layers on the sapphire substrate 10 under a pressure of 50 Torr to 200 Torr. Although the reason is unclear, it is thought that at the early stage of growth, the growth of the layer to be formed is influenced by the pressure, and thereby the finally obtained element layer 90 can be bent in a convex way.

Moreover, it will be appreciated that both the oxygen introduction method and the growth method under a pressure can be adopted.

In the present invention, the element layer 90 may be directly formed on the (0001) plane of the sapphire substrate 10 but is preferably formed via the buffer layer 20, as described above. Next, the growth of the buffer layer 20 will be described.

(Growth of Buffer Layer 20)

In the present invention, when the buffer layer 20 is provided, the preferred composition is as described above. In the present invention, although not particularly limited, the growth is preferably performed by a metal organic chemical vapor deposition (MOCVD) method.

In the semiconductor wafer 1 of the present invention, in order to obtain the curvature of the element layer 90 within the range of the present invention, it is preferable to adopt the oxygen introduction method and/or the growth method under a pressure of 50 Torr to 200 Torr, and to control the V/III ratio under the growth conditions of the buffer layer 20. That is, it is preferable to control the ratio (V/III ratio) of the number of moles of the nitrogen source gas to the number of moles of the group III raw material gas. The curvature after growth becomes high when the V/III ratio high, and the more the element layer 90 is bent convexly. The range of the V/III ratio under the production conditions is not particularly limited and is preferably 50 to 10000. It is presumed that, when the V/III ratio is within the above range, nucleation sizes are different at the early stage of growth, and thus the subsequent association process of growth nuclei is different, so that a bent semiconductor wafer can be obtained.

As a particularly preferable method, it is preferable to grow the buffer layer 20 in at least two stages. As a particularly preferable condition, it is preferable to adjust a flow rate of the raw material gas such that the V/III ratio is 2,000 to 10,000 so as to form a first buffer layer made of an AlN single crystal as a first growth step, and then to adjust the flow rate of the raw material gas supplied on the first buffer layer such that the V/III ratio is 50 to 2000 so as to further form an AlN single crystal layer, as a first growth step. After the first growth step, an AlN single crystal layer can be grown in multiple stages with the V/III ratio in a range of 50 to 2000. However, considering operability, it is preferable to form the buffer layer (second buffer layer) by two stages including a second growth step, after the first growth step. In this case, it is preferable that a thickness of the second buffer layer is larger than that of the first buffer layer. Specifically, the thickness of the first buffer layer is preferably 0.004 µm to 0.5 µm, and the thickness of the second buffer layer is preferably 0.006 µm to 4.5 µm.

In addition, as for the condition for forming the buffer layer 20, a known method can be adopted, and the nitrogen source gas (for example, ammonia) and the group III raw material gas (for example, trimethylaluminum gas, trimethylgallium gas, and trimethylindium gas) may be supplied to the sapphire substrate 10 under a flow of hydrogen or nitrogen gas at 1100° C. to 1300° C. so as to obtain a desired composition and thickness.

(Method for Growing n-Type Layer 30)

The method for growing the n-type layer 30 is also not particularly limited, and it is preferable to grow the n-type layer 30 by the MOCVD method. When the buffer layer 20 is not provided, the n-type layer 30 is directly laminated on the sapphire substrate 10. As for a condition for growing the n-type layer 30, a known method can be adopted. The growth conditions of the n-type layer 30 on the sapphire substrate 10 can be the same as those of the buffer layer 20.

As for other conditions, for example, the n-type layer 30 may be grown by supplying an n-type dopant in addition to the Al and Ga raw material gas and ammonia. Although known elements such as Si and O can be used as an element of the n-type dopant, Si is preferably used from the viewpoint of easy control or the like. As the Si raw material, monosilane ($SiH_4$), tetraethylsilane (TESi) or the like can be used.

A growth temperature at the time of growing the n-type layer 30 is not particularly limited, and is preferably 900° C. to 1100° C. A growth rate is preferably 0.1 µm/h to 2.0 µm/h. The V/III ratio is not particularly limited, and is preferably 1500 to 10000, and more preferably 2000 to 5000, in order to satisfy the growth rate in the above temperature range.

(Method for Growing Active Layer 40)

Then, same as the buffer layer 20 and the n-type layer 30, the active layer 40 can also be grown by the MOCVD method so as to satisfy a desired composition. As for a condition for forming the active layer 40, a known method can be adopted.

As for other conditions, a growth temperature of the active layer 40 is not particularly limited and is preferably more than 1000° C. to 1200° C. or lower, and preferably more than 1020° C. to 1100° C. or lower. The V/III ratio at growing the active layer 40 is not particularly limited, and is preferably 1000 to 10000, and more preferably 1500 to 8000. A growth rate of the active layer 40 is preferably 0.05 µm/h to 1.0 µm/h, and more preferably 0.1 µm/h to 0.8 µm/h. The growth rate of the active layer is preferably in the range of 0.05 µm/h to 1.0 µm/h for all layers of the quantum well layer and the barrier layer.

(Method for Growing Electron Blocking Layer 50)

The electron blocking layer 50 formed as required can also be grown by the MOCVD method. As for a condition for forming the electron blocking layer 50, a known method can be adopted.

As for other conditions, a growth temperature of the electron blocking layer 50 is not particularly limited and is preferably higher than 1020° C. to 1200° C. or lower, and more preferably higher than 1050° C. to 1150° C. or lower. A growth rate is preferably 0.1 µm/h to 1.0 µm/h, and more preferably 0.1 µm/h to 0.8 µm/h. The V/III ratio is not particularly limited, and is preferably in a range of 2000 to 20000, and more preferably in a range of 2500 to 15000. The electron blocking layer 50 can also be a p-type by adding a p-type impurity.

The electron blocking layer 50 is produced by supplying a p-type impurity in addition to the Al and Ga raw material gas and ammonia. As the p-type impurity, a known material can be used without limitation, and Mg is preferably used considering the activation energy of the p-type impurity or the like.

(Method for Growing p-Type Layer 60)

(p-Type Clad Layer 61)

The p-type clad layer 61 can also be grown by the MOCVD method. Specifically, the p-type clad layer 61 is produced by supplying a p-type impurity in addition to the Al and Ga raw material gas and ammonia. As the p-type impurity, a known material can be used without limitation, and Mg is preferably used considering the activation energy of the p-type impurity or the like.

As for a condition for forming the p-type clad layer 61, a known method can be adopted. As for a growth temperature, a growth rate, and a V/III ratio thereof, it is preferable to adopt the conditions described for the electron blocking layer 50.

(p-Type Contact Layer 62)

Similarly, the p-type contact layer 62 can also be grown by the MOCVD method, and the same impurity as of the p-type clad layer 61 can be added.

As for a condition for forming the p-type contact layer 62, a known method can be adopted. A growth temperature is not particularly limited, and is preferably 1000° C. to 1080° C., and more preferably 1020° C. to 1050° C. A growth rate is also not particularly limited, and is preferably 0.03 µm/h to 1.0 µm/h. The V/III ratio is preferably set within a range of 2000 to 15000, more preferably 4000 to 12000, and most preferably 6000 to 10000.

(Method for Forming n-Electrode 70)

The n-electrode 70 is formed on the exposed surface of the n-type layer 30. The exposed surface of the n-type layer 30 is formed by means such as etching. Preferred etching methods include dry etching such as reactive ion etching and inductively coupled plasma etching. In order to remove etching damages after forming the exposed surface of the n-type layer 30, the exposed surface is preferably subject to surface treatment with an acid or alkaline solution. In addition, patterning of the n-electrode can be performed using a lift-off method.

Examples of a method for depositing a metal forming the n-electrode include vacuum evaporation, sputtering, chemical vapor deposition or the like, and the vacuum evaporation is preferred in order to eliminate impurities in the electrode metal. The material used for the n-electrode is as described above.

(Method for Forming p-Electrode 80)

Patterning of the p-electrode 80 is preferably performed using a lift-off method. The metal material used for the p-electrode 80 is as described above. Examples of a method for depositing a metal of the p-electrode 80 include vacuum evaporation, sputtering, chemical vapor deposition or the like, and the vacuum evaporation is preferred in order to eliminate impurities in the electrode metal.

EXAMPLES

Hereinafter, the present invention will be described in detail with reference to examples, but the present invention is not limited to these examples.

Example 1

A sapphire C plane ((0001) plane) single crystal substrate (Φ2 inches×thickness 330 µm) was used as a crystal growth substrate. 5 minutes after opening an MOCVD apparatus, the sapphire substrate was placed on a susceptor in the MOCVD apparatus, and then the sapphire substrate was heated to 1230° C. for 10 minutes while flowing hydrogen at a flow rate of 13 slm (heat treatment step).

(Formation of Buffer Layer 20)

Then, the temperature of the sapphire substrate was set to 1180° C., the flow rate of trimethylaluminum was set to 13.1 µmol/min, and the flow rate of ammonia was set to 1 slm. The flow rate of the raw material gas was adjusted such that the VIII ratio at this time was 3400. An AlN single crystal layer was formed as a first buffer layer in a thickness of 0.1 µm under conditions of a total flow rate of 10 slm and a pressure of 25 Torr (a first growth step: growth of the first buffer layer).

Subsequently, the temperature of the substrate on which the AlN single crystal layer of the first buffer layer was deposited on the sapphire substrate was set to 1180° C., the flow rate of trimethylaluminum was set to 26 µmol/min, and the flow rate of ammonia was set to 0.5 slm. The flow rate of the raw material gas was adjusted such that the V/III ratio at this time was 850. An AlN single crystal layer of 1.9 µm was formed as a second buffer layer under conditions of a total flow rate of 10 slm and a pressure of 25 Torr (second growth step; growth of the second buffer layer).

(Formation of n-Type Layer 30)

Next, under conditions of a substrate temperature of 1050° C., a flow rate of trimethylaluminum of 35 µmol/min, a flow rate of trimethylgallium of 18 µmol/min, a flow rate of tetraethylsilane of 0.02 µmol/min, and a flow rate of ammonia of 1.5 slm, an n-type layer 30 having an Al composition of 70%, a Ga composition of 30% and an In composition of 0% was formed in a thickness of 2.0 µm. Meanwhile, the pressure in the apparatus was 38 Torr. At this time, a half-value width of an X-ray rocking curve of (102) plane was 700 arcsec.

(Active Layer 40)

Then, the substrate temperature was set to 1060° C., and after the temperature was constant, an $Al_{0.7}Ga_{0.3}N$ barrier layer of 7 nm was formed under the same growth conditions as those for growing the n-type layer, except that the flow rate of tetraethylsilane was 0.002 µmol/min, the flow rate of trimethylaluminum was 13.3 µmol/min, and the flow rate of trimethylgallium was 11.2 µmol/min.

Next, an $Al_{0.5}Ga_{0.5}N$ well layer of 2 nm was formed under the same conditions as those for growing the n-type layer, except that the flow rate of trimethylgallium was 40 µmol/min, and the flow rate of trimethylaluminum was 2 µmol/min. The growth of the well layer and the barrier layer was repeated for three times to form a triple quantum well layer. Meanwhile, the pressure in the apparatus was 38 Torr.

(Formation of Electron Blocking Layer 50)

Thereafter, the supply of trimethylgallium and tetraethylsilane was stopped and the substrate temperature was set to 1100° C. After the temperature was constant, an electron blocking layer 50 of 20 nm was formed under the same conditions as those for growing the n-type layer, except that bicyclopentadienyl magnesium was supplied at 1.0 µmol/min. At this time, the Al composition is 100%. Meanwhile, the pressure in the apparatus was 38 Torr.

(Formation of p-Type Layer 60)

(Formation of p-Type Clad Layer 61)

Next, with the substrate temperature as it was, a p-type clad layer 61 of 35 nm was formed under the same conditions as those for growing the n-type layer, except that bicyclopentadienyl magnesium was supplied at 1.0 µmol/min. At this time, the Al composition was 70%, the Ga composition was 30%, and the In composition was 0%. Meanwhile, the pressure in the apparatus was 38 Torr.

(Formation of p-Type Contact Layer 62)

Subsequently, the substrate temperature was changed to 1030° C. and the pressure was changed to 150 Torr, and thereafter a GaN layer of 240 nm was formed as the p-type contact layer 62 under conditions of a flow rate of trimethylgallium of 36.0 µmol/min, a flow rate of ammonia of 2.5 slm, a flow rate of bicyclopentadienyl magnesium of 0.66 µmol/min, and a flow rate of carrier gas (hydrogen) of 3.5 slm. Meanwhile, the pressure in the apparatus was 150 Torr. Accordingly, a semiconductor wafer was produced.

The curvature of the surface of the element layer 90 (p-type contact layer 62) of the obtained semiconductor wafer was measured by a laser displacement meter method. The curvature of the semiconductor wafer was 543 $km^{-1}$, and the results were shown in Table 1.

(Formation of n-Electrode 70)

The obtained semiconductor wafer was subject to heat treatment in a nitrogen atmosphere at 900° C. for 20 minutes. Thereafter, a predetermined resist pattern was formed on the surface of the p-type contact layer 62 by photolithography, and a window portion without forming a resist pattern was etched by reactive ion etching until the surface of the n-type layer 30 was exposed. Thereafter, a Ti (20 nm)/Al (200 nm)/Au (5 nm) electrode (negative electrode) was formed as the n-electrode 70 on the surface of the n-type layer 30 by a vacuum evaporation method, and heat treatment was performed under a condition of 810° C. for 1 minute in a nitrogen atmosphere.

(Formation of p-Electrode 80)

Subsequently, an Ni (20 nm)/Au (50 nm) electrode (positive electrode) was formed as the p-electrode 80 on the surface of the p-type contact layer 62 by a vacuum evaporation method, and thereafter heat treatment was performed in an oxygen atmosphere at 550° C. for 3 minutes to produce a nitride semiconductor light emitting device.

As for the obtained semiconductor light emitting device, the optical output and the wavelength at a driving current of 30 mA were 0.44 mW and 272 nm. The results were summarized in Table 1.

Example 2

A semiconductor wafer and a semiconductor light emitting device were produced under the same conditions as in Example 1, except that the flow rate of trimethylaluminum when forming the buffer layer 20 (the first growth step) was 13.1 μmol/min, and the V/III ratio at that time was 5100. When the evaluation was performed in the same manner as in Example 1, the optical output and the wavelength at a driving current of 30 mA were 0.87 mW and 269 nm, and the curvature of the semiconductor wafer was 613 km$^{-1}$. The results were shown in Table 1.

Example 3

A semiconductor wafer and a semiconductor light emitting device were produced under the same conditions as in Example 1, except that the flow rate of trimethylaluminum when forming the buffer layer 20 (the first growth step) was 6.6 μmol/min, and the V/III ratio at that time was 6800. When the evaluation was performed in the same manner as in Example 1, the optical output and the wavelength at a driving current of 30 mA were 1.48 mW and 267 nm, and the curvature of the semiconductor wafer was 701 km$^{-1}$. The results were shown in Table 1.

Comparative Example 1

(Formation of Buffer Layer 20)

The buffer layer 20 was grown to 2 μm under the conditions same as the second growth step of Example 1, except that the opening time of MOCVD apparatus before introduction of the sapphire substrate was 1 minute and the first growth step was not performed.

(Formation of n-Type Layer 30 and Layers after n-Type Layer 30)

Growth conditions for the n-type Layer 30 and the layers after the n-type layer 30 are the same as those in Example 1, then a semiconductor wafer and a semiconductor light emitting device were produced. Further, the half-value width in the (102) plane of the X-ray rocking curve when the n-type layer was formed under this condition was measured.

As for the obtained semiconductor light emitting device, the optical output and the wavelength at a driving current of 30 mA were 0.32 mW and 260 nm, and the curvature of the semiconductor wafer was 507 km$^{-1}$. The results were summarized in Table 1.

TABLE 1

| | Half-value width of n-type layer [arcsec] | Emission wavelength [nm] | Curvature [Km$^{-1}$] | Optical output [mW] |
|---|---|---|---|---|
| Example 1 | 730 | 272 | 543 | 0.44 |
| Example 2 | 720 | 269 | 613 | 0.87 |
| Example 3 | 700 | 267 | 701 | 1.48 |
| Comparative Example 1 | 800 | 260 | 507 | 0.32 |

REFERENCE SIGNS LIST

1 Semiconductor wafer
10 Sapphire substrate
20 Buffer layer
30 n-type layer
40 Active layer
50 Electron blocking layer
60 p-type layer
61 p-type clad layer
62 p-type contact layer
70 n-electrode 70
80 p-electrode 80

The invention claimed is:

1. A semiconductor wafer comprising:
an element layer comprising at least three layers including an n-type layer, an active layer, and a p-type layer on one surface of a sapphire substrate, wherein the element layer is made of a group III nitride single crystal layer,
wherein a surface of the element layer is bent in a convex way, and a curvature thereof is 530 km$^{-1}$ to 800 km$^{-1}$, and
wherein the group III nitride single crystal layer is made of an AlGaInN layer satisfying a composition represented by AlxInyGazN, wherein x, v, and z are rational numbers satisfying 0.3≤x≤1.0, 0≤y 0.7, and 0≤z≤0.7, and x+y+z=1.0.

2. The semiconductor wafer according to claim 1, wherein a plane of the sapphire substrate on which the element layer is formed is a (0001) plane.

3. A semiconductor wafer comprising:
an element layer comprising at least three layers including an n-type layer, an active layer, and a p-type layer on one surface of a sapphire substrate,
wherein a surface of the element layer is bent in a convex way, and a curvature thereof is 530 km$^{-1}$ to 800 km$^{-1}$ and
wherein a buffer layer made of AlxInyGazN, wherein x, y, and z are rational numbers satisfying 0.8≤x≤1.0, 0≤y≤0.2, and 0≤z≤0.2, and x+y+z=1.0 included between the one surface of the sapphire substrate and the element layer.

4. The semiconductor wafer according to claim 3, wherein the buffer layer includes at least two layers of a first buffer layer and a second buffer layer.

5. The semiconductor wafer according to claim 4, wherein a plane of the sapphire substrate on which the element layer is formed is a (0001) plane.

6. The semiconductor wafer according to claim 3, wherein a plane of the sapphire substrate on which the element layer is formed is a (0001) plane.

7. A semiconductor wafer comprising group III nitride single crystal layers on one surface of a sapphire substrate, comprising:

a sapphire substrate having one surface of predetermined plane orientation;

an element layer having a laminated structure including an n-type layer made of group III nitride single crystal layer, an active layer made of group III nitride single crystal layer, and a p-type layer made of group III nitride single crystal layer, is on the one surface of the sapphire substrate;

wherein the active layer is positioned between the n-type layer and the p-type layer, wherein the group III nitride single crystal layers comprise an AlGaInN layer satisfying a composition represented by AlxInyGazN, wherein x, y, and z are rational numbers satisfying $0.3 \leq x \leq 1.0$, $0 \leq y$ 0.7, and $0 \leq z \leq 0.7$, and x+y+z=1.0, and wherein a surface of the element layer is bent in a convex way, and a curvature thereof is 530 $km^{-1}$ to 800 $km^{-1}$.

8. The semiconductor wafer according to claim 7, wherein a buffer layer made of AlxInyGazN, wherein x, y, and z are rational numbers satisfying $0.8 \leq x \leq 1.0$, $0 \leq y \leq 0.2$, and $0 \leq z \leq 0.2$, and x+y+z=1.0, is included between the one surface of the sapphire substrate and the element layer.

9. The semiconductor wafer according to claim 8, wherein the buffer layer includes at least two layers of a first buffer layer and a second buffer layer.

10. The semiconductor wafer according to claim 7, wherein a plane of the sapphire substrate on which the element layer is formed is a (0001) plane.

11. A semiconductor wafer with an element circuit, comprising an n-electrode on the n-type layer and a p-electrode on the p-type layer of the semiconductor wafer according to claim 7.

12. A semiconductor light emitting device comprising group III nitride single crystal layers on one surface of a sapphire substrate, comprising:

a sapphire substrate having one surface of predetermined plane orientation;

an element layer having laminated structure including an n-type layer made of group III nitride single crystal layer, an active layer made of group III nitride single crystal layer, and a p-type layer made of group III nitride single crystal layer, is on the one surface of the sapphire substrate, wherein the active layer is positioned between the n-type layer and the p-type layer, wherein the group III nitride single crystal layers comprise an AlGaInN layer satisfying a composition represented by AlxInyGazN, wherein x, y, and z are rational numbers satisfying $0.3 \leq x \leq 1.0$, $0 \leq y$ 0.7, and $0 \leq z \leq 0.7$, and x+y+z=1.0, wherein an n-electrode is on the n-type layer and a p-electrode is on the p-type layer, and wherein a surface of the element layer is bent in a convex way, and a curvature thereof is 530 $km^{-1}$ to 800 $km^{-1}$.

13. The semiconductor light emitting device according to claim 12, wherein a buffer layer made of AlxInyGazN, wherein x, y, and z are rational numbers satisfying $0.8 \leq x \leq 1.0$, $0 \leq y \leq 0.2$, and $0 \leq z \leq 0.2$, and x+y+z=1.0, is included between the one surface of the sapphire substrate and the element layer.

14. The semiconductor wafer according to claim 13, wherein the buffer layer includes at least two layers of a first buffer layer and a second buffer layer.

15. The semiconductor light emitting device according to claim 13, wherein an emission peak wavelength is in an ultraviolet region.

16. The semiconductor light emitting device according to claim 14, wherein an emission peak wavelength is in a range of 200 nm to 350 nm.

17. The semiconductor light emitting device according to claim 12, wherein an emission peak wavelength is in an ultraviolet region.

18. The semiconductor light emitting device according to claim 12, wherein an emission peak wavelength is in a range of 200 nm to 350 nm.

19. A method for producing a semiconductor light emitting device, comprising:

preparing a semiconductor wafer comprising an element layer made of at least three layers including an n-type layer, an active layer, and a p-type layer on one surface of a sapphire substrate, wherein:

the element layer is made of a group III nitride single crystal layer, the group III nitride single crystal layer is made of an AlGaInN layer satisfying a composition represented by AlxInyGazN, wherein x, y, and z are rational numbers satisfying $0.3 \leq x \leq 1.0$, $0 \leq y$ 0.7, and $0 \leq z \leq 0.7$, and x+y+z=1.0, and a surface of the element layer is bent in a convex way, and a curvature thereof is 530 $km^{-1}$ to 800 $km^{-1}$;

preparing a semiconductor wafer with an element circuit, by forming an n-electrode on the n-type layer and a p-electrode on the p-type layer of the semiconductor wafer; and cutting the semiconductor wafer with an element circuit into semiconductor chips.

* * * * *